United States Patent
Singh

(10) Patent No.: US 6,890,793 B2
(45) Date of Patent: May 10, 2005

(54) METHOD FOR PRODUCING A SEMICONDUCTOR DIE PACKAGE USING LEADFRAME WITH LOCATING HOLES

(75) Inventor: Inderjit Singh, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/419,281

(22) Filed: Apr. 17, 2003

(65) Prior Publication Data

US 2003/0178717 A1 Sep. 25, 2003

Related U.S. Application Data

(62) Division of application No. 09/715,740, filed on Nov. 16, 2000, now Pat. No. 6,580,165.

(51) Int. Cl.[7] .................. H01L 21/283; H01L 21/60; G01L 21/58
(52) U.S. Cl. .................. 438/107; 438/108; 438/598; 438/612; 438/687; 438/164; 438/412; 438/455; 438/113; 438/618; 438/106; 438/127; 257/797; 257/738; 257/778; 257/673; 257/737; 257/696; 257/666
(58) Field of Search .................. 438/106–108, 438/598, 612, 687, 164, 412, 455, 113, 618, 127; 257/797, 673, 666, 696, 698, 734, 737, 738, 778, 786, 692, 693; 361/749, 776, 783

(56) References Cited

U.S. PATENT DOCUMENTS

| | | | | |
|---|---|---|---|---|
| 4,808,769 A | * | 2/1989 | Nakano et al. | 174/255 |
| 5,049,718 A | * | 9/1991 | Spletter et al. | 219/121.64 |
| 5,214,308 A | * | 5/1993 | Nishiguchi et al. | 257/692 |
| 5,407,864 A | * | 4/1995 | Kim | 29/834 |
| 5,805,422 A | * | 9/1998 | Otake et al. | 361/749 |
| 6,037,665 A | * | 3/2000 | Miyazaki | 257/773 |
| 6,133,065 A | * | 10/2000 | Akram | 438/108 |
| 6,262,513 B1 | * | 7/2001 | Furukawa et al. | 310/313 R |
| 6,281,046 B1 | * | 8/2001 | Lam | 438/113 |
| 6,309,915 B1 | * | 10/2001 | Distefano | 438/127 |
| 6,562,657 B1 | * | 5/2003 | Lin | 438/113 |
| 2001/0007375 A1 | | 7/2001 | Fjelstad et al. | |
| 2003/0110626 A1 | * | 6/2003 | Cobbley et al. | 29/840 |

* cited by examiner

*Primary Examiner*—Alexander Oscar Williams
(74) *Attorney, Agent, or Firm*—Townsend and Townsend and Crew, LLP

(57) ABSTRACT

A method for producing a die package is disclosed. A bumped die comprises solder bumps mounted to a leadframe including a first lead comprising a first locating hole and a second lead comprising a second locating hole. The solder bumps are present in the first and second locating holes, and a molding material is formed around the die.

5 Claims, 2 Drawing Sheets

METHOD FOR PRODUCING A SEMICONDUCTOR DIE PACKAGE USING LEADFRAME WITH LOCATING HOLES

CROSS REFERENCES TO RELATED APPLICATIONS

This application is a divisional application of U.S. patent application Ser. No. 09/715,740, filed on Nov. 16, 2000 (U.S. Pat. No. 6,580,165 B1 entitled, "FLIP CHIP WITH SOLDER PRE-PLATED LEADFRAME INCLUDING LOCATING HOLES" issued on Jun. 17, 2003). This application is hereby incorporated by reference for all purposes.

BACKGROUND OF THE INVENTION

1. Field of the Invention

The present invention relates to flip chips with solder pre-plated leadframes, and more particularly, to a flip chip with a solder pre-plated leadframe that includes locating holes for alignment.

2. Description of the Prior Art

The trend of miniaturizing packaging of semiconductor devices is driving the need to package a larger die in smaller packages. Current gold wire bond design rules limit die size to approximately 50% to 65% of the smallest dimension of the body size. Extra space is required to create a die attach area, space between the die attach area and wire bondable leads. The space prevents shorting between the die attach area and the leads. In addition, it provides some flexibility to loop the gold wire and form a reliable connection between the bond area and the bondable leads.

Methods have been developed for placing the flipped chip or "die" directly on the leadframe wherein the leadframe includes leads directly coupled to the die attach pad, thus eliminating the need for the gold wire. The chip connection to the frame is done with solder paste that is placed on the die attach pad prior to chip attachment to the frame. The solder paste is intended to hold the chip in place after the chip is attached to the frame. The eutectic solder paste will also make connection between high lead bumps on the chip to the frame. However, there are problems with this technology in handling the leadframe and the die thereon prior to reflowing the solder paste and placing the mold around the leadframe. The process window at the holding station must be controlled in order to avoid any shifting of the die. The process control and mold compound variations sometimes create a shifted die which results in opens and shorts, which thus result in a rejection of the final semiconductor. This is detrimental to the overall manufacturing yield.

SUMMARY OF THE INVENTION

The present invention provides a semiconductor device that includes a leadframe having a plurality of leads. The leadframe includes at least two alignment holes. The semiconductor device further includes a die coupled to the leadframe with solder. The alignment holes help ensure that the die remains properly positioned on the leadframe prior to the solder reflow that attaches the die to the leadframe.

In accordance with one aspect of the present invention, the leads include down set areas for receiving solder balls for coupling the die thereto.

In accordance with another aspect of the present invention, the down set is 4 mils.

The present invention also provides a method for manufacturing a semiconductor device. The method includes providing a wafer, placing solder bumps on the wafer and dicing the wafer. The resulting die is then attached to a plurality of leads that are coupled together. The die attach takes place at a heating station in order to reflow the solder bumps to solder pre-plated leads. Additionally, at least two of the leads include locating holes for receiving solder bumps and thereby properly positioning the die. Plastic molding is placed around the resulting die and coupled leads and the leads are then trimmed and formed and separated from one another.

Other features and advantages of the present invention will be understood upon reading and understanding the detailed description of the preferred exemplary embodiments, found hereinbelow in conjunction with reference to the drawings in which like numerals represent like elements.

DETAILED DESCRIPTION OF THE PREFERRED EXEMPLARY EMBODIMENTS

Figure 1:
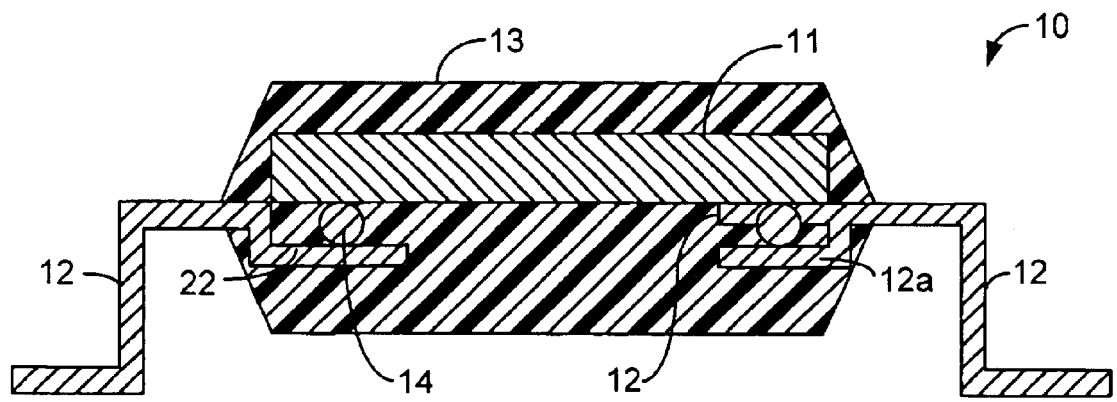
FIG. 1 is an end view of a semiconductor device in accordance with the present invention.

FIG. 1 illustrates a semiconductor device 10 including a die 11, and a plurality of leads 12. As can be seen in FIG. 1, the semiconductor device also includes an encapsulating body 13.

The semiconductor device is manufactured by providing a silicon wafer that is standard in the industry. A plurality of solder bumps 14 are arranged on the wafer and the wafer is diced to create a plurality of what are referred to in the industry as "bumped dies." Thus, die 11 is preferably a bumped die.

Figure 2:
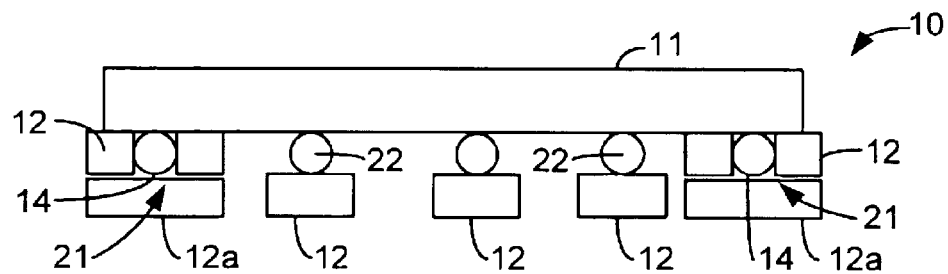
FIG. 2 is a side sectional view of a semiconductor device in accordance with the present invention.
Figure 3:
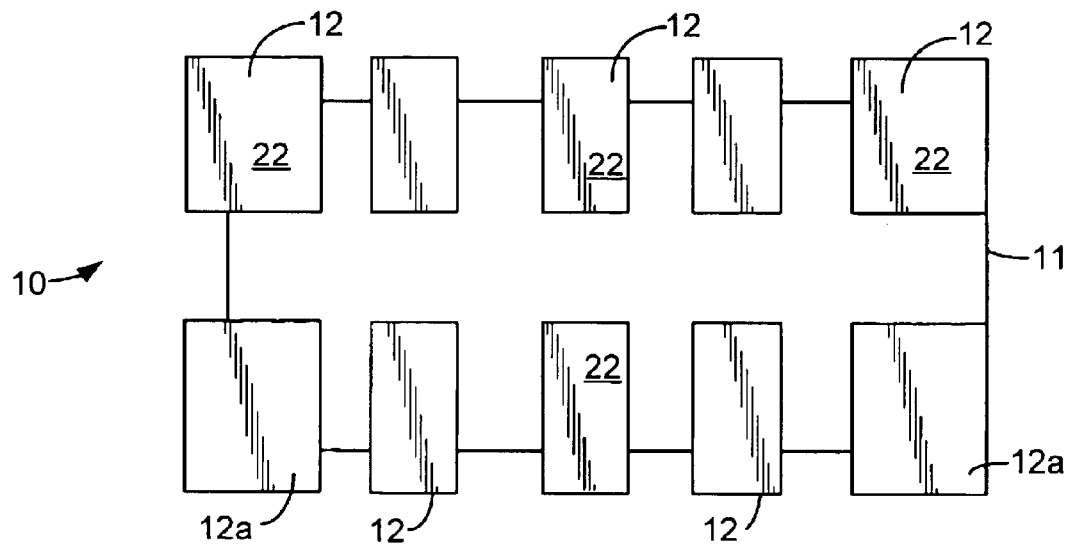
FIG. 3 is a bottom elevation view of a semiconductor device in accordance with the present invention.
Figure 4:
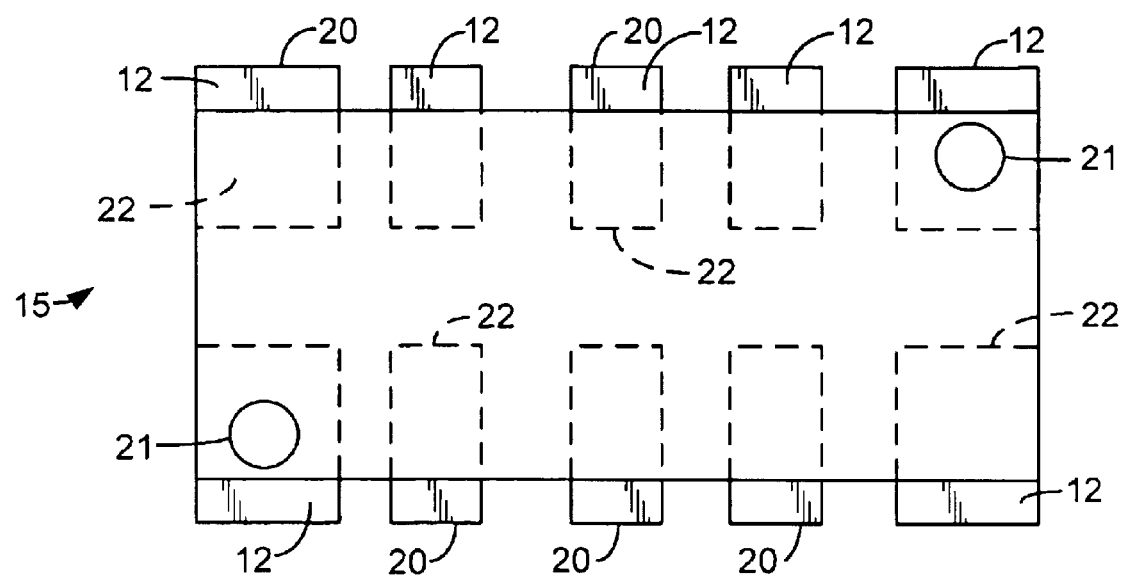
FIG. 4 is a top elevation view of a semiconductor device in accordance with the present invention.

A leadframe 15 is provided that does not include a die attach pad area. Thus, the leads are somehow coupled to one another. Preferably, they are coupled to one another at their distal ends 20. At least two of the leads include locating or alignment holes 21. The two leads may be on the same side of the leadframe, as illustrated in FIGS. 2 and 3. Alternatively, they may be in opposite corners from each other, or all four end or corner leads may include locating holes. Preferably, the holes are 100 microns or approximately the same size as the solder bumps. The leads without locating holes include solder bump contact areas 22.

The bumped die is placed on the leadframe such that two solder bumps are placed within the corresponding locating holes of the leads. This helps assure proper orientation of the die and helps ensure that it does not move during the remaining manufacturing process.

The solder bumps are then reflowed in order to couple the die to the leadframe. Preferably, the leads are solder preplated to help ensure a good connection. Preferably, the placement of the die on the leadframe takes place at a heating station so that the solder bumps may be reflowed thereby.

Molding, preferably made of plastic, is then placed around the coupled die and leadframe, thereby forming body 13. The leads are then trimmed and formed to separate the leads and to provide the resulting shape illustrated in FIG. 1.

As can be seen in FIGS. 1 and 2, preferably the leads have a downset on which the solder bumps rest. This helps prevent solder collapse and helps to maintain a steady distance between the leadframe and the die. Preferably, the downset is approximately 4 mils. As can been seen in FIG. 2, the leads that have the locating holes defined therein do not have the downset, thus allowing the solder bumps to go into the locating holes. However, the leads with locating boles do preferably include a platform 12a for supporting the solder bumps. The platforms 12a are substantially coplanar with solder bump contact areas 22. Preferably, the platforms also have a downset. In a preferred embodiment, the bump and lead pitch may vary from 0.5 mm to 0.75 mm.

FIG. 3 illustrates a semiconductor device 10 in accordance with the present invention from the bottom. Thus, platforms 12a and solder bump contact areas 22 are visible. The illustration is primarily schematic and thus, does not reflect the bends within the leads 12.

Thus, the present invention allows a packaging die size up to 85% of the package body size. The locating holes help ensure that the die is properly oriented and that it remains properly oriented during the manufacturing process. Additionally, by directly coupling the die to leads and eliminating the gold wire bond technology, manufacturing cost is reduced and productivity is improved.

Although the invention has been described with reference to specific exemplary embodiments, it will appreciated that it is intended to cover all modifications and equivalents within the scope of the appended claims.

What is claimed is:

1. A method comprising:

(a) providing a bumped wafer;

(b) dicing the bumped wafer to create at least one bumped die comprising solder bumps including a first solder bump and a second solder bump;

(c) providing a leadframe including a first lead comprising a first locating hole and a second lead comprising a second locating hole;

(d) placing the bumped die on the leadframe such that the first solder bump is present in the first locating hole and the second solder bump is located in the second locating hole;

(e) reflowing the solder bumps; and (f) forming a molding material around the die.

2. The method of claim 1 wherein the leadframe includes a downset portion.

3. The method of claim 1 wherein the leadframe is preplated.

4. The method of claim 1 wherein the first and second solder bumps are at a pitch of from about 0.5 mm to about 0.75 mm.

5. The method of claim 1 wherein the molding material comprises plastic.

* * * * *